(12) United States Patent
Akiyoshi

(10) Patent No.: US 7,817,119 B2
(45) Date of Patent: Oct. 19, 2010

(54) DISPLAY DEVICE AND METHOD OF MANUFACTURING THE DISPLAY DEVICE

(75) Inventor: Muneharu Akiyoshi, Saitama (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 697 days.

(21) Appl. No.: 11/754,180

(22) Filed: May 25, 2007

(65) Prior Publication Data

US 2007/0228937 A1 Oct. 4, 2007

Related U.S. Application Data

(63) Continuation of application No. PCT/JP2005/022568, filed on Dec. 8, 2005.

(30) Foreign Application Priority Data

Dec. 15, 2004 (JP) ............................. 2004-363313

(51) Int. Cl.
*G09G 3/32* (2006.01)

(52) U.S. Cl. ..................... 345/76; 315/169.3; 313/500

(58) Field of Classification Search .................. 345/76, 345/82, 204; 313/503–504, 500; 427/66, 427/162; 438/67, 82; 349/106–108, 143; 445/24; 315/169.3
See application file for complete search history.

(56) References Cited

U.S. PATENT DOCUMENTS

| 6,137,220 | A | 10/2000 | Nagayama et al. |
| 7,274,140 | B2 * | 9/2007 | Ito et al. ..................... 313/504 |
| 7,580,014 | B2 * | 8/2009 | Tanaka et al. ................ 345/81 |
| 7,646,044 | B2 * | 1/2010 | Huh et al. ................... 257/286 |
| 2002/0158835 | A1 | 10/2002 | Kobayashi et al. |
| 2003/0006697 | A1 | 1/2003 | Weaver |
| 2004/0004214 | A1 | 1/2004 | Yamazaki et al. |

FOREIGN PATENT DOCUMENTS

| JP | 2002-318553 A | 10/2002 |
| JP | 2002-318556 A | 10/2002 |
| JP | 2003-257654 A | 9/2003 |
| JP | 2004-047447 A | 2/2004 |
| TW | 200301665 | 7/2003 |
| TW | 1220240 | 8/2004 |

\* cited by examiner

*Primary Examiner*—Abbas I Abdulselam
(74) *Attorney, Agent, or Firm*—Oblon, Spivak, McClelland, Maier & Neustadt, L.L.P.

(57) ABSTRACT

A display area composed of matrix-arrayed pixels includes partition walls which separate the pixels, a first electrode which is disposed in an independent insular shape in association with each of the pixels, an organic active layer which is disposed on the first electrode, and a second electrode which is common to all the pixels and is so disposed as to cover the organic active layer of each of the pixels and to expose parts of the partition walls.

7 Claims, 4 Drawing Sheets

DISPLAY DEVICE AND METHOD OF MANUFACTURING THE DISPLAY DEVICE

CROSS-REFERENCE TO RELATED APPLICATIONS

This is a Continuation Application of PCT Application No. PCT/JP2005/022568, filed Dec. 8, 2005, which was published under PCT Article 21(2) in Japanese.

This application is based upon and claims the benefit of priority from prior Japanese Patent Application No. 2004-363313, filed Dec. 15, 2004, the entire contents of which are incorporated herein by reference.

BACKGROUND OF THE INVENTION

1. Field of the Invention

The present invention relates to a display device and a method of manufacturing the display device, and more particularly to a method of manufacturing a display device which is composed of a plurality of self-luminous elements.

2. Description of the Related Art

In recent years, organic electroluminescence (EL) display devices have attracted attention as flat-panel display devices. Since the organic EL display device is a self-luminous device, it has such features as a wide viewing angle, small thickness without a need for backlight, low power consumption, and a high responsivity speed.

For these features, the organic EL display device is a promising candidate for the next-generation flat-panel display device, which will take the place of liquid crystal display devices. The organic EL display device is configured such that a plurality of organic EL elements are arranged in a matrix on an array substrate. Each organic EL element has such a structure that an optical active layer containing an organic compound with a light-emitting function is held between an anode and a cathode.

As regards an active-matrix organic EL display device, there is known a structure in which auxiliary wiring lines are provided on an upper electrode (e.g. cathode) that is commonly provided to respective organic EL elements (see, for instance, Jpn. Pat. Appln. KOKAI Publication No. 2002-318553 and Jpn. Pat. Appln. KOKAI Publication No. 2002-318556).

Normally, the upper electrode is disposed so as to cover the entirety of the organic active layer and partition walls in the display area. In other words, the respective parts, which are formed in fabrication steps preceding to the step of forming the upper electrode, are covered with the upper electrode. In this structure, if part of the upper electrode is damaged, moisture or gas component, which is contained in the respective parts, may easily evaporate from the damaged part. As a result, characteristics of the organic EL element will differ between the vicinity of the damaged part and the region of the other parts, leading to non-uniformity in emission light luminance.

BRIEF SUMMARY OF THE INVENTION

The present invention has been made in consideration of the above-described problem, and the object of the invention is to provide a display device capable of improving display performance, and a method of manufacturing the display device.

According to a first aspect of the invention, there is provided a display device having a display area composed of matrix-arrayed pixels, the display area characterized by comprising:

partition walls which separate the pixels;
a pixel circuit which is disposed in association with each of the pixels; and
a display element which is driven and controlled by the pixel circuit,
the display element comprising:
a first electrode which is disposed in an independent insular shape in association with each of the pixels;
an optical active layer which is disposed on the first electrode; and
a second electrode which is disposed to cover the optical active layer of each of the pixels, and
the second electrode comprising:
a plurality of opening parts from which parts of the partition walls are exposed, the opening parts being arranged at regular intervals over the entire display area.

According to a second aspect of the invention, there is provided a method of manufacturing a display device having a display area composed of matrix-arrayed pixels, characterized by comprising:

a step of forming a first electrode in an independent insular shape in association with each of the pixels;
a step of forming partition walls which separate the pixels;
a step of forming an optical active layer on the first electrode; and
a step of forming a second electrode which covers the optical active layer of each of the pixels in the display area,
wherein the step of forming the second electrode includes a step of forming a plurality of opening parts from which parts of the partition walls are exposed, the opening parts being arranged at regular intervals over the entire display area.

DETAILED DESCRIPTION OF THE INVENTION

A display device and a method of manufacturing the display device according to an embodiment of the present invention will now be described with reference to the accompanying drawings. In the embodiment, a self-luminous display device, for instance, an organic EL (electroluminescence) display device, is exemplified as the display device.

Figure 1:
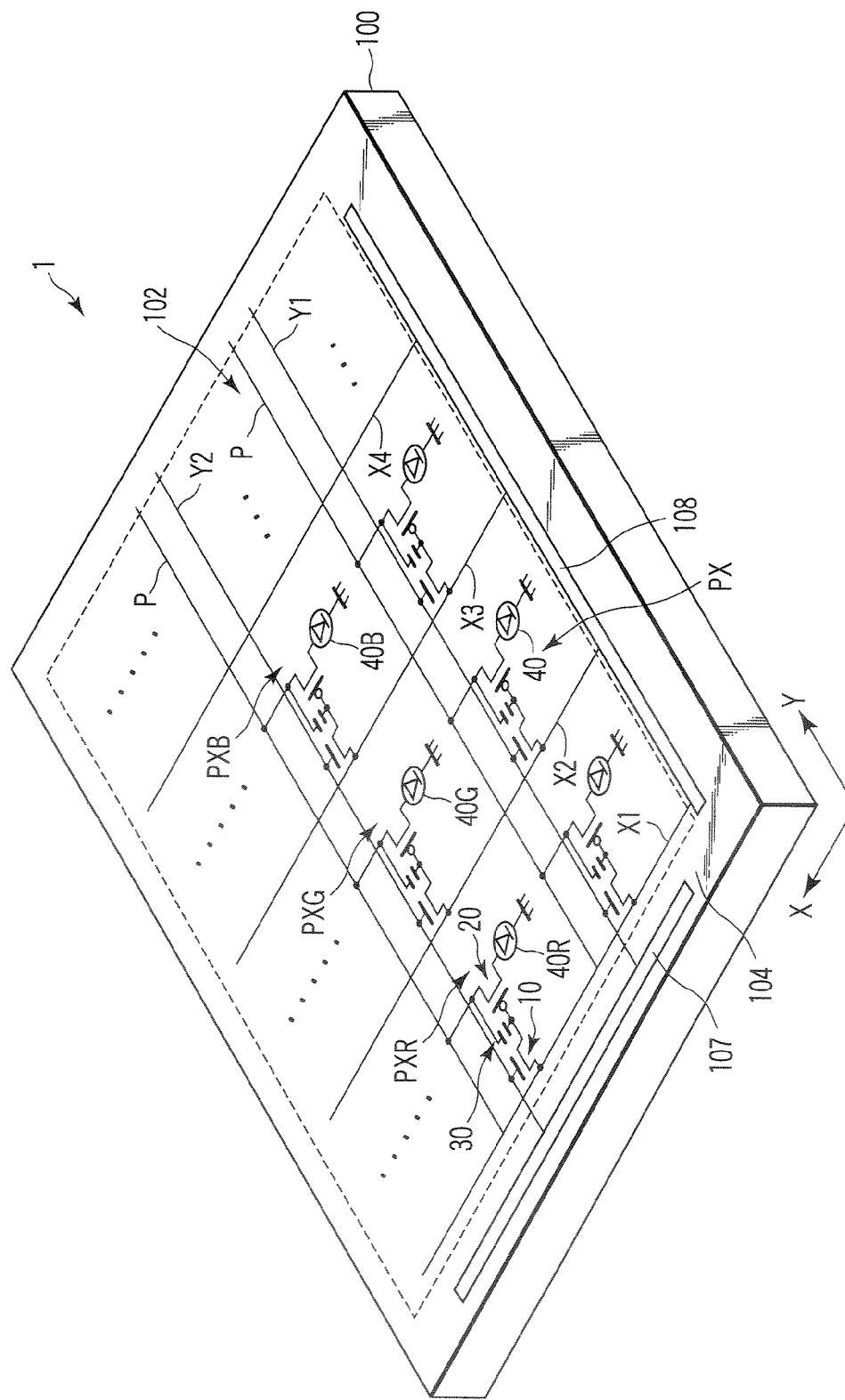
FIG. 1 schematically shows the structure of an organic EL display device according to an embodiment of the present invention.
Figure 2:
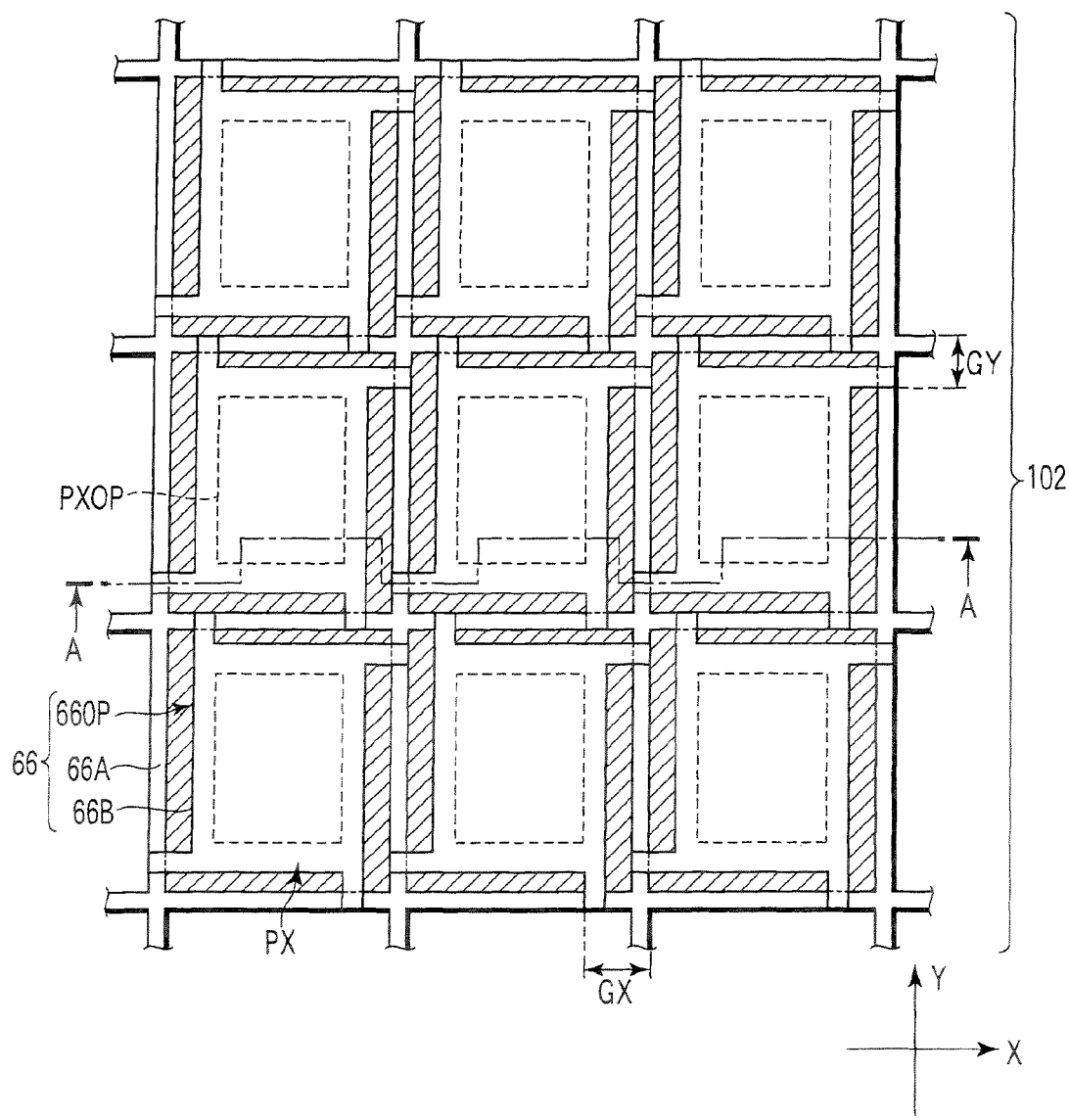
FIG. 2 is a plan view that schematically shows an example of layout of a display area on an array substrate of the organic EL display device shown in FIG. 1.

As is shown in FIG. 1 and FIG. 2, an organic EL display device 1 includes an array substrate 100 having a display area 102 which displays an image. The display area 102 of the array substrate 100 is composed of a plurality of pixels PX (R, G, B) that are arranged in a matrix.

The array substrate 100 includes a plurality of scan lines Ym (m=1, 2, ... ) that are arranged in a row direction (i.e. Y-direction in FIG. 1) of pixels PX, a plurality of signal lines Xn (n=1, 2, ... ) that are arranged in a direction (i.e. X-direction in FIG. 1) that crosses the scan lines Ym substantially at right angles, and power source supply lines P for supplying power to first electrodes 60 of organic EL elements 40.

The array substrate 100 further includes, in a peripheral area 104 that is provided around the outer periphery of the display area 102, at least a part of a scan line driving circuit 107 which supplies scan signals to the scan lines Ym, and at least a part of a signal line driving circuit 108 which supplies video signals to the signal lines Xn. All scan lines Ym are connected to the scan line driving circuit 107. All signal lines Xn are connected to the signal line driving circuit 108.

Each of the pixels PX (R, G, B) includes a pixel circuit and a display element that is driven and controlled by the pixel circuit. The pixel circuit includes a pixel switch 10 having a function of electrically separating an ON pixel and an OFF pixel and holding a video signal that is to be supplied to the ON pixel; a driving transistor 20 that supplies a desired driving current to the display element on the basis of the video signal that is supplied via the pixel switch 10; and a storage capacitance element 30 that holds a gate-source potential of the driving transistor 20 for a predetermined time period. The pixel switch 10 and driving transistor 20 are composed of, e.g. thin-film transistors. In this embodiment, polysilicon is used as a semiconductor layer of the thin-film transistor.

The display element is composed of an organic EL element 40 (R, G, B) that is a self-luminous display element. Specifically, a red pixel PXR includes an organic EL element 40R that principally emits light of a red wavelength. A green pixel PXG includes an organic EL element 40G that principally emits light of a green wavelength. A blue pixel PXB includes an organic EL element 40B that principally emits light of a blue wavelength.

Each kind of organic EL element 40 (R, G, B) has basically the same structure. Each organic EL element 40 comprises a first electrode 60 which is formed in an independent insular shape for each pixel PX on a pixel-by-pixel basis; a second electrode 66 which is disposed to face the first electrode 60 and is formed commonly to all the pixels PX; and an optical active layer, for instance, an organic active layer 64, which is held between the first electrode 60 and the second electrode 66.

The pixel switch 10 is disposed near an intersection between the scan line Ym and signal Xn. A gate electrode of the pixel switch 10 is connected to the scan line Ym, a source electrode of the pixel switch 10 is connected to the signal line Xn, and a drain electrode of the pixel switch 10 is connected to one electrode of the storage capacitance element 30 and to a gate electrode of the driving transistor 20. A source electrode of the driving transistor 20 is connected to the other electrode of the storage capacitance element 30 and to the power source supply line P. A drain electrode of the driving transistor 20 is connected to the first electrode 60 of the organic EL element 40.

Figure 3:
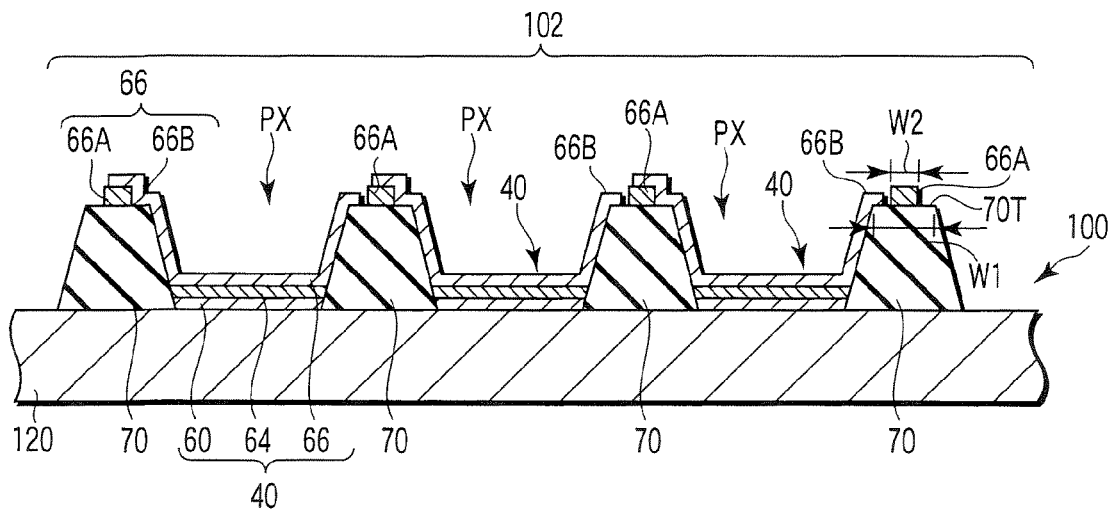
FIG. 3 is a cross-sectional view taken along line A-A in FIG. 2, which schematically shows the structure of the array substrate.

As is shown in FIG. 2 and FIG. 3, the array substrate 100 includes a plurality of organic EL elements 40 which are disposed on a wiring substrate 120. The wiring substrate 120 is configured such that the pixel switch 10, driving transistor 20, storage capacitance element 30, scan line driving circuit 107, signal line driving circuit 108 and various lines (scan lines, signal lines, power source supply lines, etc.) are provided on an insulating support substrate such as a glass substrate or a plastic sheet.

The first electrode 60 of the organic EL element 40 is disposed on an insulating film (e.g. a planarizing layer), which is formed on the surface of the wiring substrate 120, and functions as an anode.

The organic active layer 64 includes at least a light-emitting layer. The organic active layer 64 may include, in addition to the light-emitting layer, a hole transport layer that is common to the respective colors, and thus the organic active layer 64 may have a two-layer structure comprising the hole transport layer and a light-emitting layer that is formed for each color pixel. Alternatively, the organic active layer 64 may include a hole injection layer, a blocking layer, an electron transport layer, an electron injection layer and a buffer layer, or the organic active layer 64 may include a layer in which the functions of these layers are integrated. In the organic active layer 64, it is necessary that only the light-emitting layer be formed of an organic material. The layers other than the light-emitting layer may be formed of either an inorganic material or an organic material. The light-emitting layer is formed of an organic compound having a light-emitting function of emitting red, green or blue light.

The second electrode 66 is disposed on the organic active layer 64 commonly to all the organic EL elements 40. The second electrode 66 is formed of a light-transmissive electrically conductive material. In this embodiment, the second electrode 66 is formed of an electrically conductive oxide having an electron injection function, such as ITO (Indium Tin Oxide) or IZO (Indium Zinc Oxide), and the second electrode 66 functions as a cathode.

The array substrate 100 includes partition walls 70 that separate the pixels RX (R, G, B) in the entire display area 102 at least between the neighboring colors. It is preferable that the partition walls 70 be so formed as to separate the respective color pixels. In this embodiment, the partition walls 70 are arranged in a lattice shape along the peripheral edges of the first electrodes 60, and are formed such that the shape of an opening defined by the partition walls, from which the first electrode 60 is exposed, becomes rectangular. The partition walls 70 may be arranged not in the lattice shape but in stripes extending only in the X-direction or Y-direction. Such partition walls 70 are formed of a resin material.

In the organic EL device 40 with the above-described structure, electrons and holes are injected in the organic active layer 64 that is held between the first electrode 60 and second electrode 66. The electron and hole are recombined to form an exciton, and light is produced by photo-emission of a predetermined wavelength which occurs when the exciton is deactivated. The EL light is emitted from the upper surface side of the array substrate 100, that is, from the second electrode 66 side, and thus the display screen is formed.

In the meantime, a shortcoming of the organic EL element 40 is weakness to moisture, but it is difficult to sufficiently eliminate moisture. It is thus necessary to control distribution of moisture in the organic EL element and to eliminate non-uniform distribution of moisture. In general, the organic EL element 40 is airtightly sealed and a desiccating agent is sealed in the inside.

On the other hand, the organic EL element 40 of each pixel, which is separated by the partition walls 70, includes the first electrode 60 and organic active layer 64, which are disposed on a pixel-by-pixel basis, and the second electrode 66 which is common to all the pixels. Normally, the second electrode 66 is a solid film which is formed on the entirety of the display area 102, and covers, with a certain degree of airtightness, the entire partition walls 70 which are disposed between the pixels.

However, if a part of the second electrode 66 is damaged, the airtightness of the region near the damaged part deteriorates and residual moisture in the partition wall 70 may easily evaporate. Consequently, the moisture remaining in the partition wall 70 decreases and can prevent degradation of the neighboring organic EL element 40. On the other hand, in the region covered by the second electrode 66, moisture remaining in the partition wall 70 does not easily evaporate, and may degrade the neighboring organic EL element 40. As a result, a difference occurs in characteristics between the region near the damage part of the second electrode 66 and the other region. When the same driving current is supplied, a difference will occur in emission light luminance.

In the present embodiment, the second electrode 66 of the organic EL elements 40 is so disposed as to cover the organic active layers 64 of the pixels, and to expose parts of the partition walls 70 at the peripheral parts of the pixels. Specifically, the second electrode 66 has, over the entire display area 102, a plurality of openings which expose parts of the partition walls 70 and are arranged at regular intervals. By positively forming the exposed parts of the partition walls 70, evaporation of residual moisture in the partition walls 70, which surround the pixels, is facilitated.

Since the phenomenon of moisture evaporation can occur in all the pixels within the display area, it becomes possible to prevent a local variation in characteristics between the organic EL elements. Evaporated moisture is absorbed by the desiccating agent that is sealed together with the organic EL elements 40. In short, by virtue of the structure which can always cause the same degree of the moisture evaporation phenomenon in all the pixels, the difference in characteristics between the organic EL elements of all the pixels can be reduced (i.e. the difference in emission light luminance can be reduced), and the display performance can be improved.

The structure of the second electrode 66 will now be described in greater detail. Specifically, as shown in FIG. 2 and FIG. 3, the second electrode 66 includes power supply lines 66A, which are disposed on the partition walls 70 and are supplied with potential for the second electrode, and an electrode part 66B which is connected to the power supply lines 66A and is disposed at least on the organic active layers 64.

In the example shown in FIG. 2, the power supply lines 66A are disposed in a lattice shape on the partition walls 70 which are formed in a lattice shape along peripheral edges of the first electrodes 60. As shown in FIG. 3, each partition wall 70 has a substantially trapezoidal cross section, and the width W1 of an upper surface 70T, on which the power supply line 66A is disposed, is, e.g. 30 to 40 μm. In this case, the line width W2 of the power supply line 66A is set to be less than the width W1 of the upper surface 70T, and is, e.g. 5 to 6 μm.

The electrode part 66B is so disposed as to cover a pixel opening portion (an exposed part of the first electrode 60 which is substantially exposed from partition walls 70) PXOP within an inside surrounded by the partition walls 70. In addition, a part of the electrode part 66B extends to the upper surface 70T of the partition wall 70 and is electrically connected to the power supply line 66A. Thereby, a potential for the second electrode can be supplied to the electrode part 66B. In the example shown in FIG. 2, the electrode part 66B is connected to the power supply lines 66A which are disposed on the four sides. Thus, a part of the partition wall 70 (a part of the upper surface 70T in the example of FIG. 3) is not covered with the power supply line 66A and electrode part 66B, and is exposed. In other words, the part surrounded by the power supply lines 66A and electrode part 66B corresponds to an opening part 66OP of the second electrode 66. Opening parts 66OP, which extend in the X-direction, are arranged in the X-direction at equal intervals GX. Opening parts 66OP, which extend in the Y-direction, are arranged in the Y-direction at equal intervals GY. The intervals GX and GY are so set as to form opening parts 66OP of substantially the same area in the respective pixels. In the example shown in FIG. 2, the opening parts 66OP are disposed on the four sides of each pixel. The total area of the opening parts 66OP is set to be equal between the pixels. Thus, a difference in characteristics of the organic EL elements of all the pixels can be reduced.

The power supply line 66A and electrode part 66B may be formed of different electrically conductive materials. Specifically, electrically conductive materials which are usable for the electrode part 66B are limited. In particular, in the upper-surface emission system, a light-transmissive electrically conductive material is selected. On the other hand, since the power supply line 66A is disposed on the partition wall 70 and does not affect the opening ratio of the pixel, the material for the power supply line 66A is not necessary a light-transmissive material. Rather, a low-resistance electrically conductive material, which has a low voltage drop, is desired. Thus, if proper electrically conductive materials are selected in order to form the power supply line 66A and electrode part 66B, an organic EL element with desired characteristics can be formed.

The power supply line 66A and electrode part 66B may be formed of the same electrically conductive material. If the same electrically conductive material is selected in order to form the power supply line 66A and electrode part 66B, the power supply line 66A and electrode part 66B can integrally be formed in the same fabrication step. Compared to the case of forming them in different fabrication steps, the number of fabrication steps can be reduced, the manufacturing cost can be reduced and the manufacturing yield can be improved.

Next, a method of manufacturing the display device with the above-described structure is described.

Figure 4A:
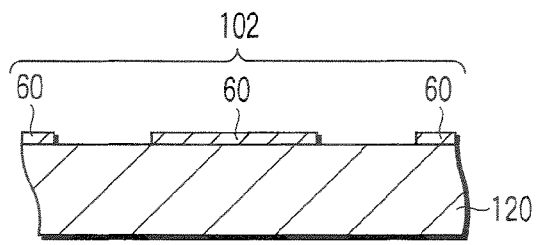
FIG. 4A is a view for describing a fabrication step for manufacturing the organic EL display device, FIG. 4A illustrating a step of forming a first electrode.

To begin with, processes for forming and patterning metal films and insulating films are repeated, thereby preparing a wiring substrate 120 having a display area 102 composed of 920,000 pixels (480 pixels in the vertical direction and 640×3 (R, G, B) pixels in the horizontal direction). As shown in FIG. 4A, a first electrode 60 is formed for each pixel in the display area 102 on the wiring substrate 120. In general, the first electrode 60 may be formed by a photolithography process or by mask-sputtering using a mask having a pattern corresponding to the first electrode.

Figure 4B:
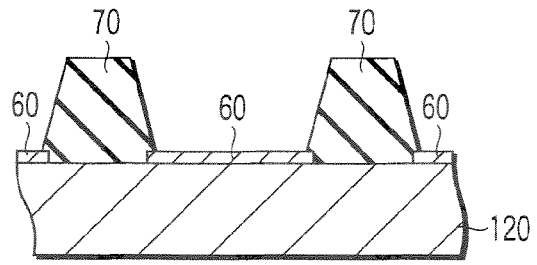
FIG. 4B is a view for describing a fabrication step for manufacturing the organic EL display device, FIG. 4B illustrating a step of forming partition walls.

Subsequently, as shown in FIG. 4B, partition walls 70 for separating the pixels are formed. Specifically, a photosensitive resin material, such as an acrylic type positive-tone resist, is used and patterned by an ordinary photolithography process. The patterned resist is baked at 220° C. for 30 minutes. Thereby, lattice-shaped partition walls 70, which surround each pixel, are formed.

Figure 4C:
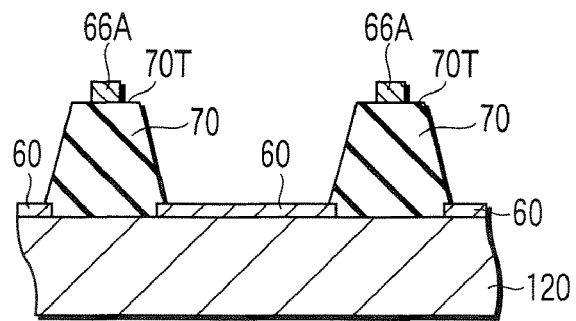
FIG. 4C is a view for describing a fabrication step for manufacturing the organic EL display device, FIG. 4C illustrating a step of forming power supply lines.

As shown in FIG. 4C, power supply lines 66A are formed on the partition walls 70. Specifically, an aluminum (Al) film is formed as a metal film on the major surface of the wiring substrate 120 on which the partition walls 70 are formed. Thereafter, the metal film is patterned by, e.g. a photolithography process, and lattice-shaped power supply lines 66A are formed on the upper surfaces 70T of the partition walls 70.

Figure 4D:
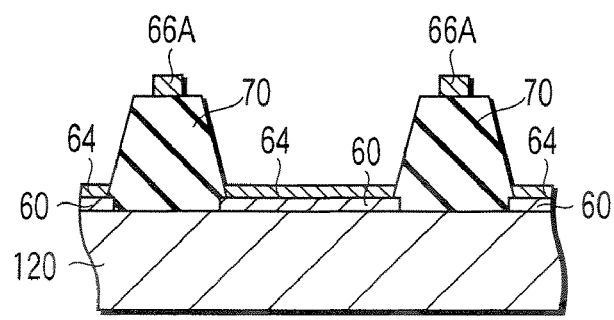
FIG. 4D is a view for describing a fabrication step for manufacturing the organic EL display device, FIG. 4D illustrating a step of forming an organic active layer.

Then, as shown in FIG. 4D, an organic active layer 64, which includes a light-emitting layer, a hole buffer layer, etc., is formed on the first electrode 60 in each pixel. In a case where a high-polymer material is selected for the organic active layer 64, it is possible to coat the material by an ink-jet process. In a case where a low-molecular-weight material is selected for the organic active layer 64, it is possible to form the organic active layer 64 by vapor deposition via a mask having a pixel pattern.

In a case where the above-described step of forming the power supply lines 66A includes a wet process such as a photolithography process, it is desirable to form the power supply lines 66A prior to the organic active layer 64 in order to prevent the organic active layer 64 from being damaged by moisture. In a case where the step of forming the power supply lines 66A comprises only a dry process, the order of formation processes may freely be chosen.

Figure 4E:
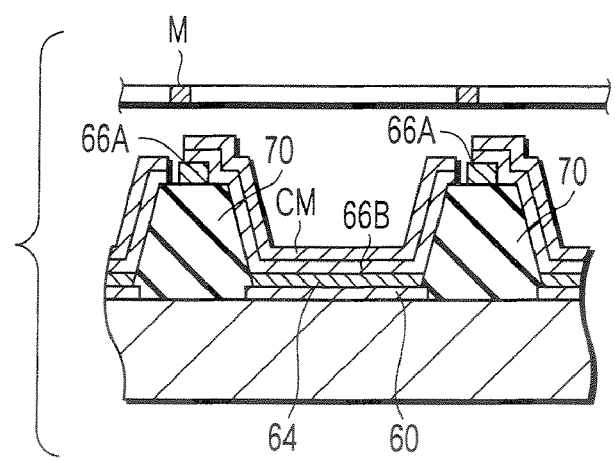
FIG. 4E is a view for describing a fabrication step for manufacturing the organic EL display device, FIG. 4E illustrating a step of forming an electrode part and a cover metal.

Following the above, as shown in FIG. 4E, an electrode part 66B for covering the organic active layer 64 of each pixel in the display area 102 is formed. Specifically, a metal film of barium (Ba) with a thickness of 600 Å, which functions as a cathode, is formed by vapor deposition at a degree of vacuum of $10^{-7}$ Pa via a mask M having a pattern corresponding to the electrode part 66B. Subsequently, using the same mask M, a metal film of aluminum (Al) with a thickness of 1500 Å to 3000 Å, which functions a cover metal, is formed by vapor deposition. The electrode part 66B and cover metal CM are formed with a size greater than the pixel opening part (the exposed part of the first electrode 60 that is substantially exposed from the partition walls 70) by 10 µm. The electrode part 66B and cover metal CM have such a pattern as to come in contact with the power supply lines 66A on the four sides. The thus formed electrode part 66B functions, together with the power supply lines 66A which are connected to the electrode part 66B on the partition walls 70, as the second electrode 66 which exposes parts of the partition walls 70 that are provided on the peripheral sides of each pixel.

On the other hand, in order to seal the display area 102 on the array substrate 100, an ultraviolet-curing seal material is applied to an outer peripheral part of a sealing member. In an inert gas atmosphere such as nitrogen gas or argon gas, the array substrate 100 and sealing member are attached. Thereby, the organic EL element 40 is sealed in the closed space of the inert gas atmosphere. Subsequently, ultraviolet is radiated to cure the seal material.

In the thus formed color-display-type active matrix organic EL display device, a uniform emission light luminance was obtained when the same driving current was supplied, and good display performance was realized. Moreover, it was confirmed that a luminance half-life period is increased, compared to the prior-art system, and a sufficient performance of the device can be maintained.

The present invention is not limited to the above-described embodiment. At the stage of practicing the invention, various embodiments may be made by modifying the structural elements without departing from the spirit of the invention. Structural elements disclosed in the embodiment may properly be combined, and various inventions may be made. For example, some structural elements may be omitted from the embodiment. Moreover, structural elements in different embodiments may properly be combined.

For example, the partition walls 70 and the power supply lines 66A on the partition walls 70 may not necessarily have lattice patterns, and the number of connection parts between the power supply lines 66A and the electrode part 66B is not limited to four.

In the above-described embodiment, the power supply lines 66A and the electrode part 66B are formed of different electrically conductive materials. Needless to say, the power supply lines 66A and the electrode part 66B may be formed at the same time by using the same material.

The present invention can provide a display device capable of improving display performance, and a method of manufacturing the display device.

What is claimed is:

1. A display device having a display area composed of matrix-arrayed pixels,
    the display area comprising:
        partition walls which separate the pixels;
        a pixel circuit which is disposed in association with each of the pixels; and
        a display element which is driven and controlled by the pixel circuit;
    the display element comprising:
        a first electrode which is disposed in an independent insular shape in association with each of the pixels;
        an optical active layer which is disposed on the first electrode; and
        a second electrode which is disposed to cover the optical active layer of each of the pixels; and
    the second electrode comprising:
        a plurality of opening parts from which parts of the partition walls are exposed, the opening parts being arranged at regular intervals over the entire display area,
    wherein the second electrode includes a power supply line which is disposed on the partition wall and to which a potential for the second electrode is applied, and an electrode part which is connected to the power supply line and is disposed at least on the optical active layer.

2. The display device according to claim 1, wherein the power supply line and the electrode part are formed of different electrically conductive materials.

3. The display device according to claim 1, wherein the power supply line and the electrode part are formed of the same electrically conductive material.

4. A method of manufacturing a display device having a display area composed of matrix-arrayed pixels, comprising:
    a step of forming a first electrode in an independent insular shape in association with each of the pixels;
    a step of forming partition walls which separate the pixels;
    a step of forming an optical active layer on the first electrode; and
    a step of forming a second electrode which covers the optical active layer of each of the pixels in the display area,
    wherein the step of forming the second electrode includes a step of forming a plurality of opening parts from which parts of the partition walls are exposed, the opening parts being arranged at regular intervals over the entire display area,
    wherein the step of forming the second electrode includes a step of forming a power supply line which is disposed on the partition wall and to which a potential for the second electrode is applied, and a step of forming an electrode part which is connected to the power supply line and is disposed at least on the optical active layer.

5. The method of manufacturing a display device according to claim 4, wherein the second electrode is formed by vapor depositing an electrically conductive material via a mask having a predetermined pattern.

6. The method of manufacturing a display device according to claim 4, wherein the step of forming the power supply line is performed prior to the step of forming the optical active layer.

7. The method of manufacturing a display device according to claim 4, wherein in the step of forming the second electrode, the power supply line and the electrode part are formed at the same time.

* * * * *